US008054983B2

(12) United States Patent
Bai et al.

(10) Patent No.: US 8,054,983 B2
(45) Date of Patent: Nov. 8, 2011

(54) METHOD FOR PARAMETER IDENTIFICATION AND PARAMETER OPTIMIZATION OF MICROSPEAKERS

(75) Inventors: Mingsian R. Bai, Hsinchu (TW); Rong Liang Chen, Jiadong Twonship, Pingtung County (TW)

(73) Assignee: National Chiao Tung University, Hsinchu (TW)

( * ) Notice: Subject to any disclaimer, the term of this patent is extended or adjusted under 35 U.S.C. 154(b) by 1475 days.

(21) Appl. No.: 11/493,547

(22) Filed: Jul. 27, 2006

(65) Prior Publication Data

US 2007/0258598 A1 Nov. 8, 2007

(30) Foreign Application Priority Data

May 5, 2006 (TW) .............................. 95116064 A

(51) Int. Cl.
*H04R 29/00* (2006.01)
*H03G 3/20* (2006.01)

(52) U.S. Cl. ................. 381/59; 382/56; 382/57; 382/58

(58) Field of Classification Search .............. 381/56–59, 381/103, 98; 333/28 T
See application file for complete search history.

(56) References Cited

U.S. PATENT DOCUMENTS 4,483,015 A * 11/1984 Strohbeen ..................... 381/103
6,400,825 B1 6/2002 Miyamoto et al.
6,690,809 B2 2/2004 Miyamoto et al.

FOREIGN PATENT DOCUMENTS

JP 2001197585 A * 7/2001
TW I221193 9/2004

OTHER PUBLICATIONS

W. Marshall Leach, Jr., Loudspeaker Voice-Coil Inductance Losses: Circuit Models, Parameter Estimation, and Effect on Frequency Response; J. Audio Eng. Soc., vol. 50, No. 6, Jun. 2002.
Richard H. Small, Closed-Box Loudspeaker Systems Part I: Analysis; Journal of the Audio Engineering Society; vol. 20, No. 10, Dec. 1972.
Richard H. Small, Closed-Box Loudspeaker Systems Part II: Synthesis; Journal of the Audio Engineering Society; vol. 21, No. 1, Jan./Feb. 1973.
Mingsian R. Bai and Jerwoei Liao, Acoustic Analysis and Design of Miniature Loudspeakers for Mobile Phones, J. Audio Eng. Soc., vol. 53, No. 11, Nov. 2005.
A.N. Thiele, Loudspeakers in Vented Boxes: Part I; Journal of the Audio Engineering Society, vol. 19, No. 5, May 1971.
A.N. Thiele, Loudspeakers in Vented Boxes: Part II: Journal of the Audio Engineering Society, vol. 19, No. 6, Jun. 1971.

* cited by examiner

*Primary Examiner* — Devona Faulk
(74) *Attorney, Agent, or Firm* — Rosenberg, Klein & Lee

(57) ABSTRACT

The present invention discloses a method for parameter identification and parameter optimization of microspeakers. Measurement procedures for identifying electromechanical constants of microspeaker and a GUI are developed to facilitate estimation of electroacoustic parameters of the microspeaker under test. In light of the thus identified microspeaker parameters, a parameter optimization procedure is carried out to obtain the design that attains the best acoustic performance with minimum harmonic distortion.

44 Claims, 5 Drawing Sheets

METHOD FOR PARAMETER IDENTIFICATION AND PARAMETER OPTIMIZATION OF MICROSPEAKERS

BACKGROUND OF THE INVENTION

1. Field of the Invention

The present invention concerns a method for parameter identification and parameter optimization of a speaker, in particular a method for parameter identification and parameter optimization of a microspeaker.

2. Description of the Related Art

Micro speakers have been extensively used in electronic products recently as important components in mobile phones, digital cameras, personal digital assistants and MPEG3 display devices. In order to achieve the best performance and the minimum harmonic distortion of microspeakers, it is necessary to estimate relevant electroacoustic parameters thereof.

Speaker parameters refer to the physical properties which affect the performance of a speaker mechanically and acoustically such as the resonance frequency, frequency response, mechanical system quality factor and electrical system quality factor. However, conventional parameter identification tools for the electroacoustic system of speakers, such as the procedure proposed by R. H. Small in "Closed-Box Loudspeaker Systems Part 1: Analysis", *Journal of the Audio Engineering Society,* 1972, can only apply to large-size speakers. When the conventional parameter identification tools are applied to a microspeaker, the results will be incorrect because the volume of the microspeaker is too small to perform a precise measurement. Currently, the technology of microspeakers focuses on the fields of the design, assemblage, and impedance measurement, and appropriate system and method for the evaluation and analysis of microspeakers have not appeared yet.

Accordingly, the present invention proposes a method for parameter identification and parameter optimization of electroacoustic systems of microspeakers.

SUMMARY OF THE INVENTION

To attain the advantages of the present method and overcome the disadvantages of the conventional method in accordance with the purpose of the invention as embodied and broadly described herein, the present invention provides a means for parameter identification of microspeakers. Measurement procedures are required to identify the electromechanical constants of the microspeaker under test.

Another objective of the present invention is to provide a method for parameter optimization of microspeakers with the aid of an optimization algorithm. An optimal parameter design of a micro speaker under limiting conditions can be obtained to achieve the best acoustic performance and minimum harmonic distortion.

In the present invention, an external circuit serves as the front-end to measure the impedance frequency response of the microspeaker. The front-end comprising a passive circuit and a signal analyzer is capable of measuring the impedance frequency response of the microspeaker as a dedicated impedance analyzer.

To achieve the abovementioned objective, the present invention proposes a method for parameter identification of a microspeaker, wherein firstly, the impedance frequency response of a microspeaker is measured; next, the microspeaker is placed inside a test box to measure its impedance frequency response; next, a first simulation circuit is used to simulate the peak value of the impedance frequency response curve, and a second simulation circuit is used to simulate the peak value of the inside-test box impedance frequency response curve; then, the transfer functions of the first simulation circuit and the second simulation circuit are calculated to obtain the parameters of the microspeaker.

In the measurement of impedance frequency response, a voltage is input into a passive circuit, which comprises the microspeaker and a load with known impedance, and then, the voltage and the obtained voltage drop over the load are input to a signal analyzer to calculate the impedance frequency response of the microspeaker.

In the microspeaker parameter optimization of the present invention, parameter identification is performed for at least one micro speaker firstly; next, a target parameter and at least one limit parameter that is used as a limiting condition, are selected from parameters; then, the target parameter is optimized under the limiting condition with an optimization algorithm.

These and other objectives of the present invention will become obvious to those of ordinary skill in the art after reading the following detailed description of preferred embodiments.

It is understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Figure 1:
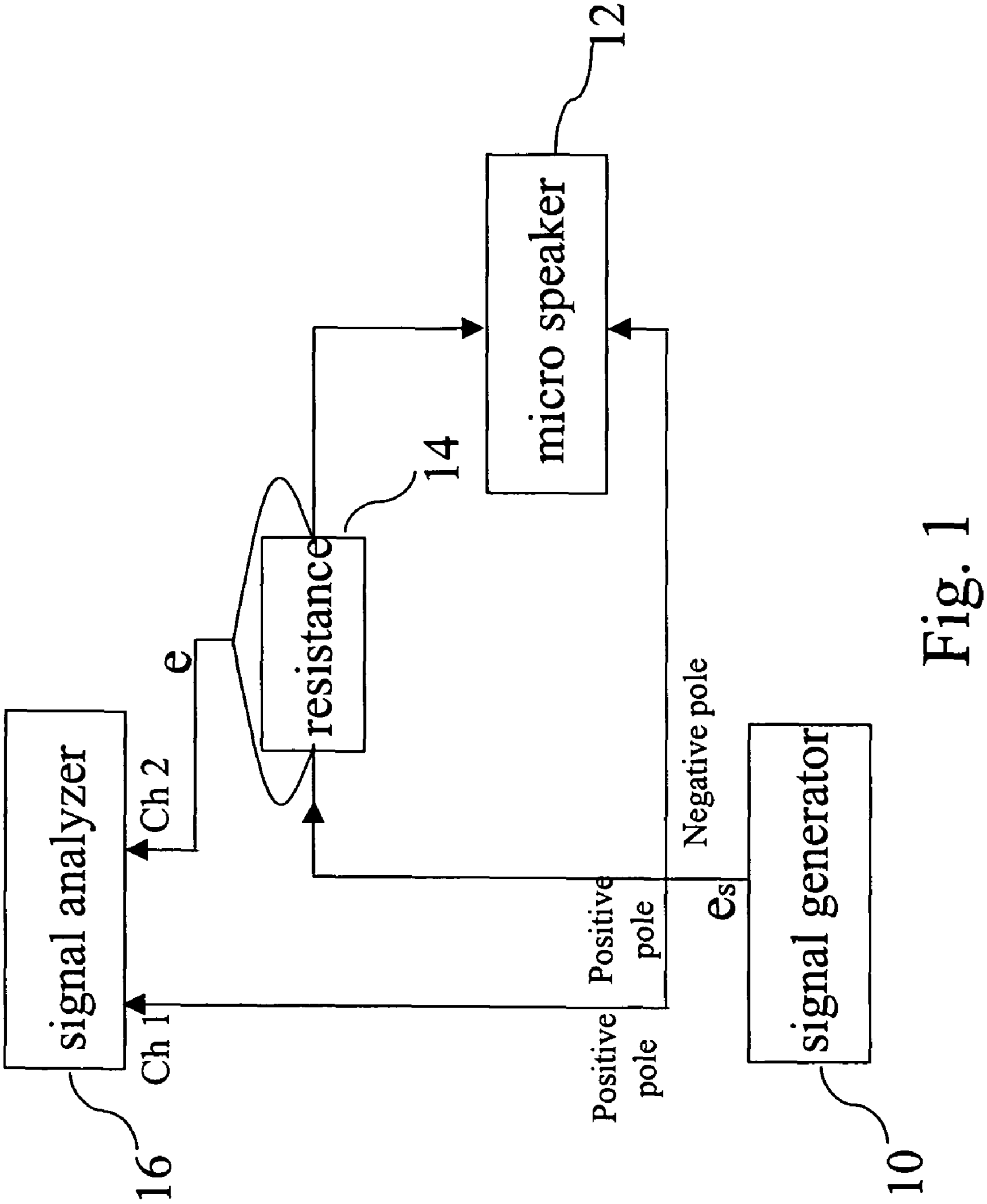
FIG. 1 is a diagram showing an impedance frequency response measurement device according to one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The present invention utilizes a front-end device to measure the impedance frequency response of a microspeaker and utilizes a test-box method to obtain the impedance curve of the microspeaker. The electromechanical parameters of the microspeaker are calculated according to the impedance curve. After the electromechanical parameters have been identified, the performances of the microspeaker are evaluated, including: sound-pressure sensitivity, efficiency, total harmonic distortion, and inter-modulation distortion. Then, the analysis and design for optimizing the electromechanical parameters of the microspeaker are undertaken to obtain the best output performance of the microspeaker.

Refer to FIG. 1 a diagram showing an impedance frequency response measurement device according to one embodiment of the present invention. In this embodiment, a signal generator 10, a microspeaker 12 and a load 14 with a known impedance form a measurement circuit, and a resistor is used as the load herein. The signal generator 10 outputs an alternating voltage $e_s$, one branch of the positive pole of the signal generator 10 is connected to a signal analyzer 16, such as a first channel ch1 of the spectrum analyzer; via the resistor 14, the other branch of the positive pole of the signal generator 10 is connected to the microspeaker 12; and the negative pole of the signal generator 10 is also connected to microspeaker 12. When a current flows through the resistor 14, there is a voltage drop e occurring, and thus, the voltage over the microspeaker 12 is $e_s-e$. Therefore, once the voltage drop over the resistor 14 is obtained and input into the signal analyzer 16 via a second channel ch2 thereof, the signal analyzer 16 can calculate the impedance frequency response Z of the microspeaker 12 according to the equation $$Z = R\frac{e_s - e}{e} = R\left(\frac{1}{H(f)} - 1\right),$$

wherein H(f) is the impedance frequency response of the resistor 14, and R is the impedance of the resistor 14.

Figure 2:
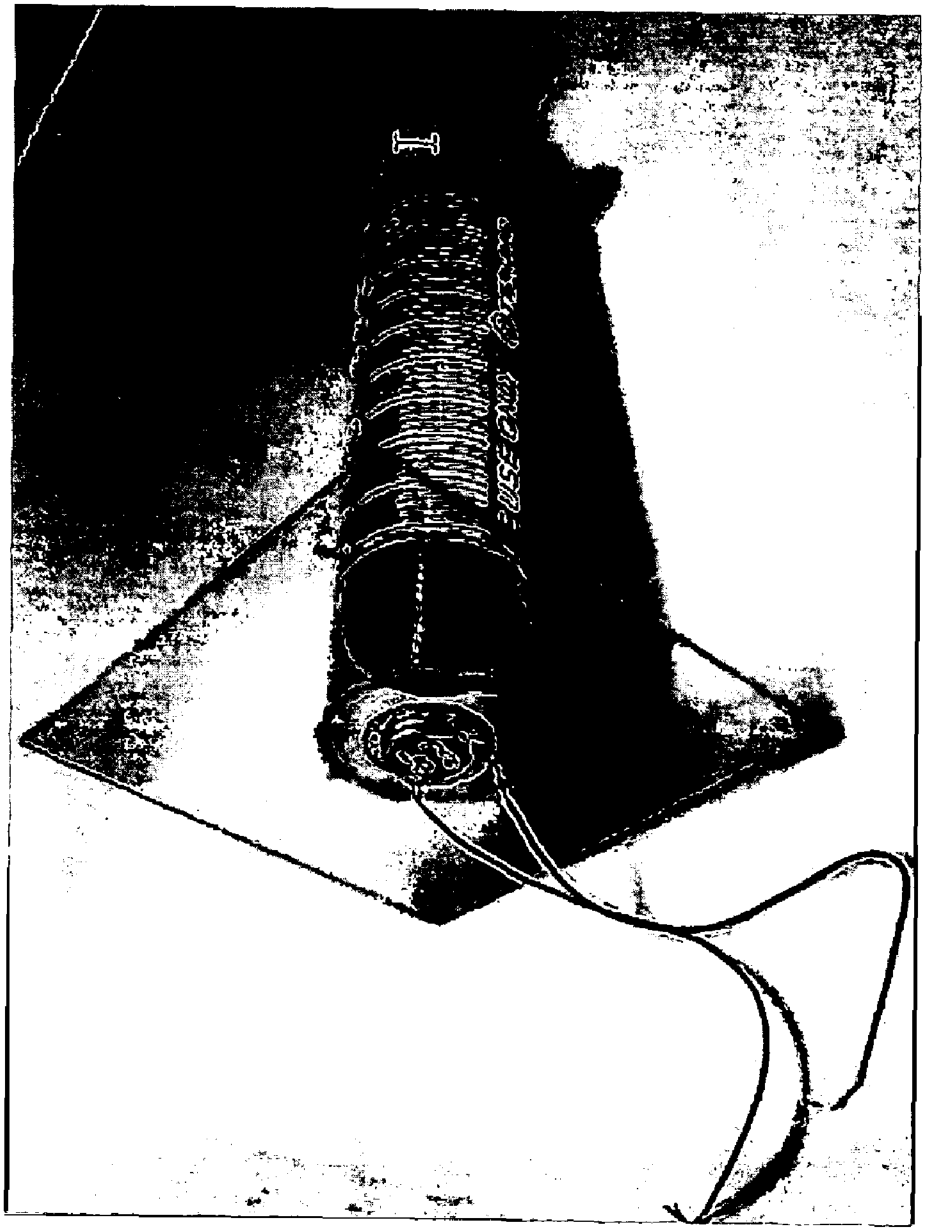
FIG. 2 is a diagram showing a test box according to the present invention.
Figure 3:
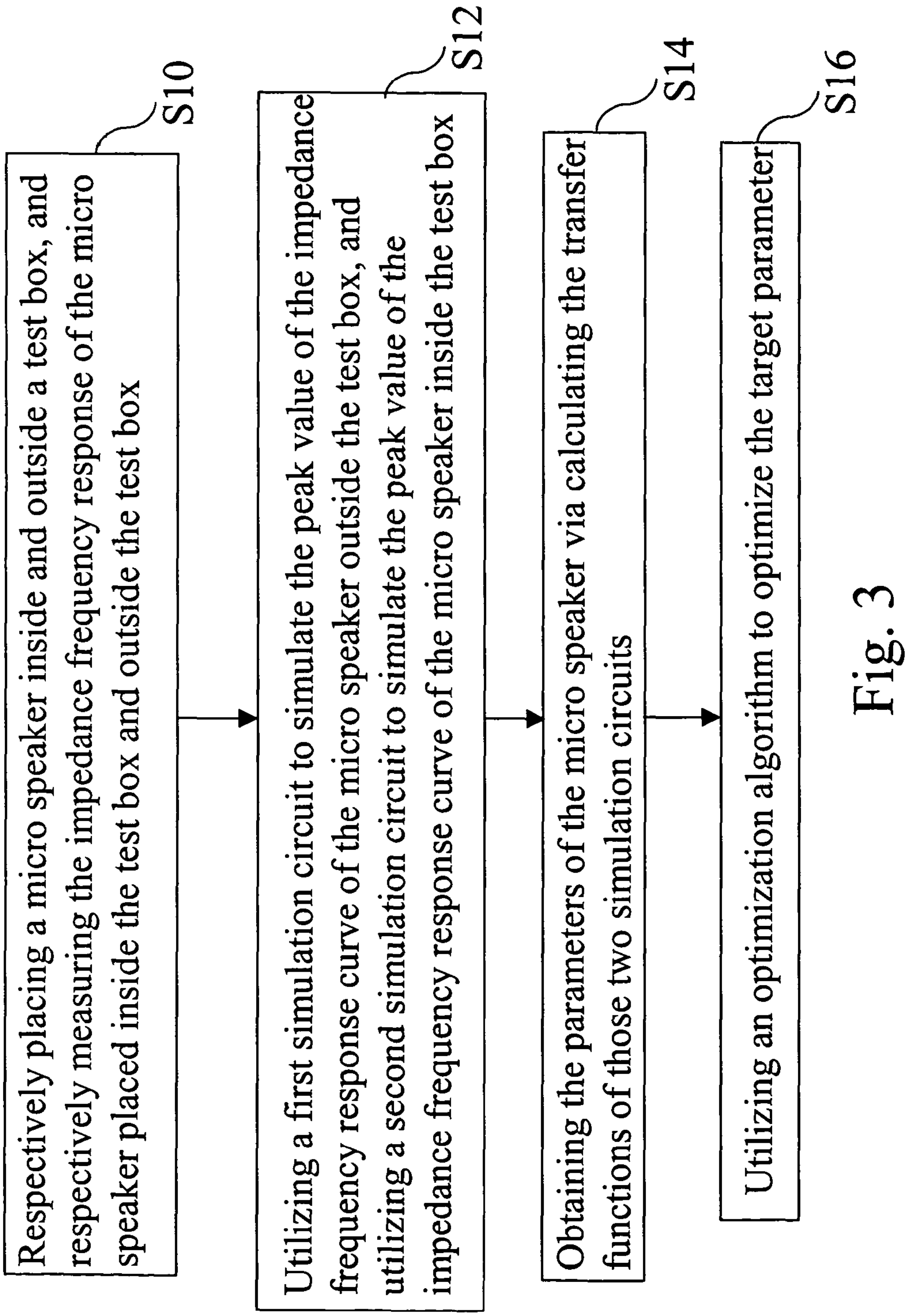
FIG. 3 is a flowchart of the method for parameter identification and parameter optimization according to the present invention.
Figure 4:
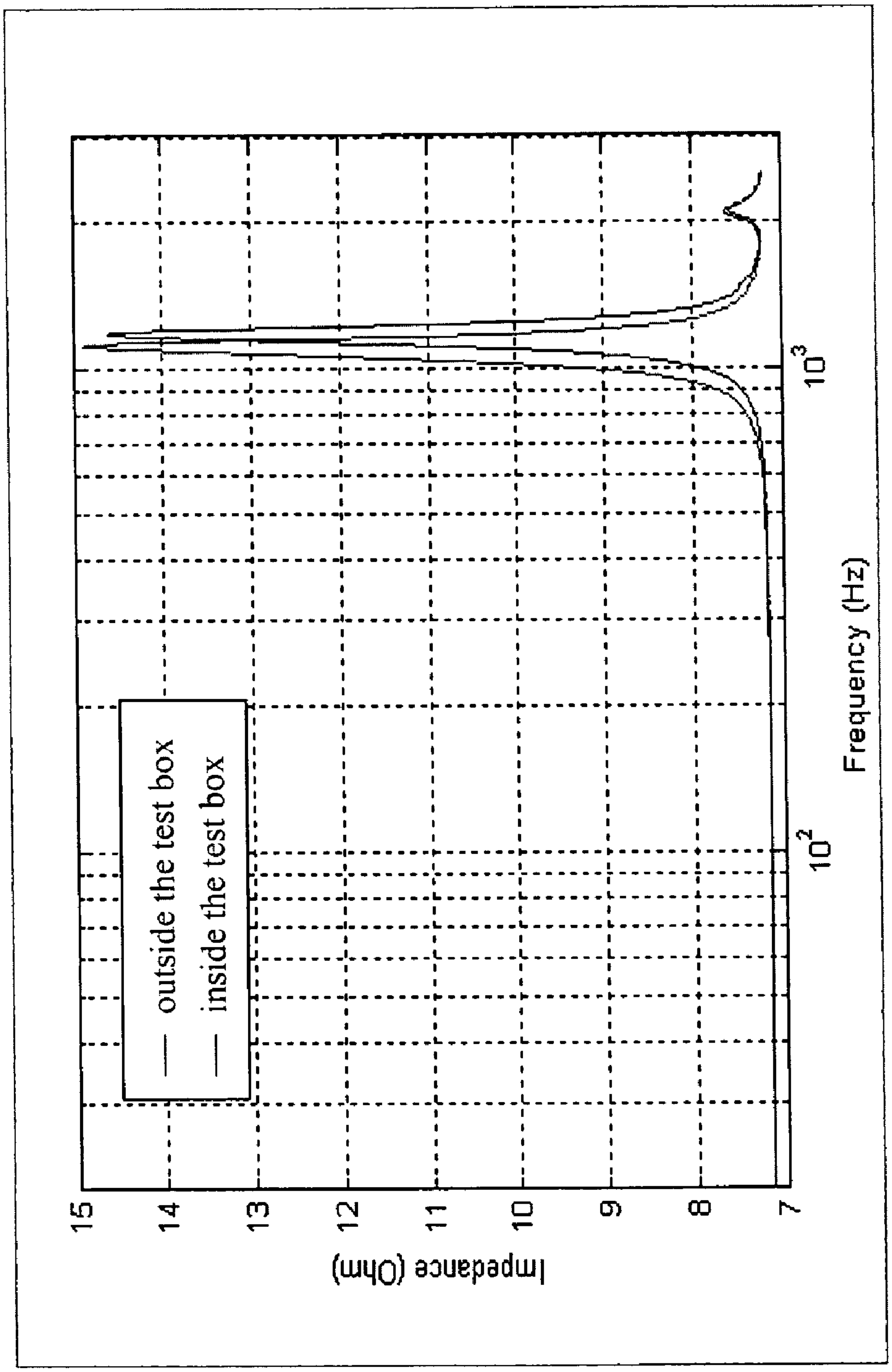
FIG. 4 is a diagram showing the results of measuring the impedance frequency response of a microspeaker respectively disposed inside and outside a test box.

After the impedance frequency response of the microspeaker has been obtained, the parameters of the microspeaker can be measured. Limited by the size of the microspeaker, the parameter identification is undertaken with a test-box method in the present invention, as shown in FIG. 2. The test box must be an airtight chamber, and no air leakage is permitted. Refer to FIG. 3 a flowchart of the parameter identification and parameter optimization process according to the present invention. In Step 10, the microspeaker is respectively disposed inside and outside the test box, and the measurement device shown in FIG. 1 is used to measure the inside-test box impedance frequency response and the outside-test box impedance frequency response respectively. The results are shown in FIG. 4, and the red curve represents the outside-test box impedance frequency response curve of the microspeaker, and the blue curve represents the inside-test box impedance frequency response curve of the microspeaker.

Next, the process proceeds to Step 12. A first simulation circuit, which comprises a resistor, an inductor and a capacitor, is used to simulate the peak value of the outside-test box impedance frequency response curve of the microspeaker. A second simulation circuit, which also comprises a resistor, an inductor and a capacitor, is used to simulate the peak value of the inside-test box impedance frequency response curve of the microspeaker. The objective of the abovementioned simulation is to utilize a curve-fitting method to identify the mechanical system quality factor $Q_{MS}$ and the closed-box system electrical quality factor $Q_{EC}$. The simulation steps comprise selecting appropriate resistance R, inductance M, and capacitance C so that the peak value of the frequency response curve of the first simulation circuit comprising said resistor, said inductor and said capacitor is the same as the peak value of the outside-test box impedance frequency response curve of the microspeaker; comparing the coefficients of the second order transfer function $$\frac{1}{j\omega M + R + \frac{1}{j\omega C}}$$

of the inductor, resistor and capacitor with $$\frac{1}{s^2 + 2\zeta\omega_s s + \omega_s^2},$$

the resonance frequency $\omega_S$ and the mechanical system quality factor $Q_{MS}$ of the microspeaker are then identified by utilizing Equation (1) to (3), as shown in Step 14, wherein Equations (1) to (3) are respectively expressed by:

$$\omega_s = 2\pi f_s \tag{1}$$

$$Q_{MS} = \frac{1}{2\zeta} \tag{2}$$

$$Q_{ES} = Q_{MS}\left(\frac{R_E}{R_{ES}}\right) \tag{3}$$

Similarly, the inside-test box resonance frequency $f_c$ of the microspeaker and the closed-box system electrical quality factor $Q_{EC}$ are obtained via comparing the coefficients of the second order transfer function of the second simulation circuit. After the closed-box system electrical quality factor $Q_{EC}$ and the mechanical system quality factor $Q_{MS}$ have been identified, the equivalent volume of the microspeaker can be calculated via the equation $$V_{AS} = V_T\left(\frac{f_c}{f_s}\frac{Q_{EC}}{Q_{ES}} - 1\right),$$

wherein $V_T$ is the volume of the test box. The mechanical mass of the vibrating diaphragm $M_{MD}$, the mass of the mechanical system of the vibrating diaphragm and air load $M_{MS}$ and the mechanical compliance of the vibrating diaphragm suspension $C_{MS}$ can be identified with Equations (4) to (6), which are expressed by:

$$C_{MS} = \frac{V_{AS}}{\rho_0 c^2 S_D^2} \tag{4}$$

$$M_{MS} = \frac{1}{\omega_S^2 C_{MS}} \tag{5}$$

$$M_{MD} = M_{MS} - 2M_1 \tag{6}$$

wherein $\rho_0$ is the air density; $S_D$ is the effective area of the vibrating diaphragm; $M_1$ is the low-frequency air load impedance. The mechanical resistance of the vibrating diaphragm $R_{MS}$ and the motor constant B1 can be obtained with Equations (7) and (8), which are respectively expressed by:

$$R_{MS} = \frac{\omega_S M_{MS}}{Q_{MS}} \tag{7}$$

-continued $$Bl = \sqrt{\frac{\omega_S R_E M_{MS}}{Q_{ES}}} \tag{8}$$

The other important parameters, such as the acoustic compliance of vibrating diaphragm suspension $C_{AS}$, the acoustic mass of the vibrating diaphragm and air load $M_{AS}$, the acoustic resistance of suspension loss $R_{AS}$, the capacitance driving the total displacement mass $C_{MES}$, the inductance driving the mechanical compliance $L_{CES}$, the acoustic resistance of suspension loss and electrical loss $R_{AT}$, the total mechanical resistance of suspension loss and electrical loss $R_{MT}$, and the mechanical mass of the vibrating diaphragm $M_{MD}$, are respectively identified by:

$$C_{AS} = S_D^2 C_{MS} \tag{9}$$

$$M_{AS} = \frac{M_{MS}}{S_D^2} \tag{10}$$

$$R_{AS} = \frac{R_{MS}}{S_D^2} \tag{11}$$

$$C_{MES} = \frac{M_{MS}}{Bl^2} \tag{12}$$

$$L_{CES} = Bl^2 C_{MS} \tag{13}$$

$$R_{AT} = R_{AE} + R_{AS} \tag{14}$$

$$R_{MT} = R_{AT} + S_D^2 \tag{15}$$

$$M_{MD} = M_{MS} - 2S_D^2 M_A \tag{16}$$

wherein $R_{AE}$ is the acoustic resistance of electrical loss, and $M_A$ is the acoustic mass. The equivalent coil resistance and the equivalent coil inductance of the speaker can be identified with the following equations:

$$Z_E(j\omega) \approx (j\omega)^n L_E \tag{17}$$

$$\Rightarrow R'_E = \left[\frac{L_e}{\cos(n\pi/2)}\right]\omega^n,\ L_E = \left[\frac{L_e}{\sin(n\pi/2)}\right]\omega^{n-1}$$

The values of n and $L_e$ can be worked out with the measured value $Z_{VC}$ and the following equation:

$$Z_E = Z_{VC} - R_E \tag{18}$$

$$n = \frac{1}{90}\tan^{-1}\left[\frac{\mathrm{Im}(Z_E)}{\mathrm{Re}(Z_E)}\right] = \frac{\ln|Z_2| - \ln|Z_1|}{\ln\omega_2 - \ln\omega_1},\ L_e = \frac{|Z_E|}{\omega^n}$$

The calculation of the abovementioned parameters can be implemented with software having calculation function, such as Matlab GUI. After the outside-test box impedance response frequency of the microspeaker, the inside-test box impedance response frequency of the microspeaker and the size of the test box have been input, Matlab can automatically calculate the values of the abovementioned parameters. Therefore, the parameter identification method of the present invention can be presented in the form of a computer program.

Further, the present invention proposes an optimization method for the parameters of microspeakers. Since microspeakers are limited in volume and thickness, and the elements of a microspeaker are separately fabricated before assembled, it is hard to ensure that the elements are perfect matching, and the acoustic volume and quality of the microspeaker is hard to achieve the best performance. Thus, an optimization method is needed to fully achieve the designed performance of microspeakers. In the optimization method of the present invention, a target parameter and a limit parameter (used as a limiting condition) are selected from parameters; under the limiting condition, an optimization algorithm is used to perform optimization and find the maximum or minimum of the target parameter, as shown in Step 16. For example, when the target parameter is the axial sound pressure sensitivity $p_{sens}^{1V}$, it is the value of the sound pressure sensitivity at the axial distance of 1 meter and under an input voltage $e_g$=1 $V_{rms}$. The limiting condition may be the displacement of the vibrating diaphragm, the density of magnetic flux, the acoustic compliance, the resonance frequency, etc. The aim of the optimization is to obtain the maximum sound pressure sensitivity.

Figure 5:
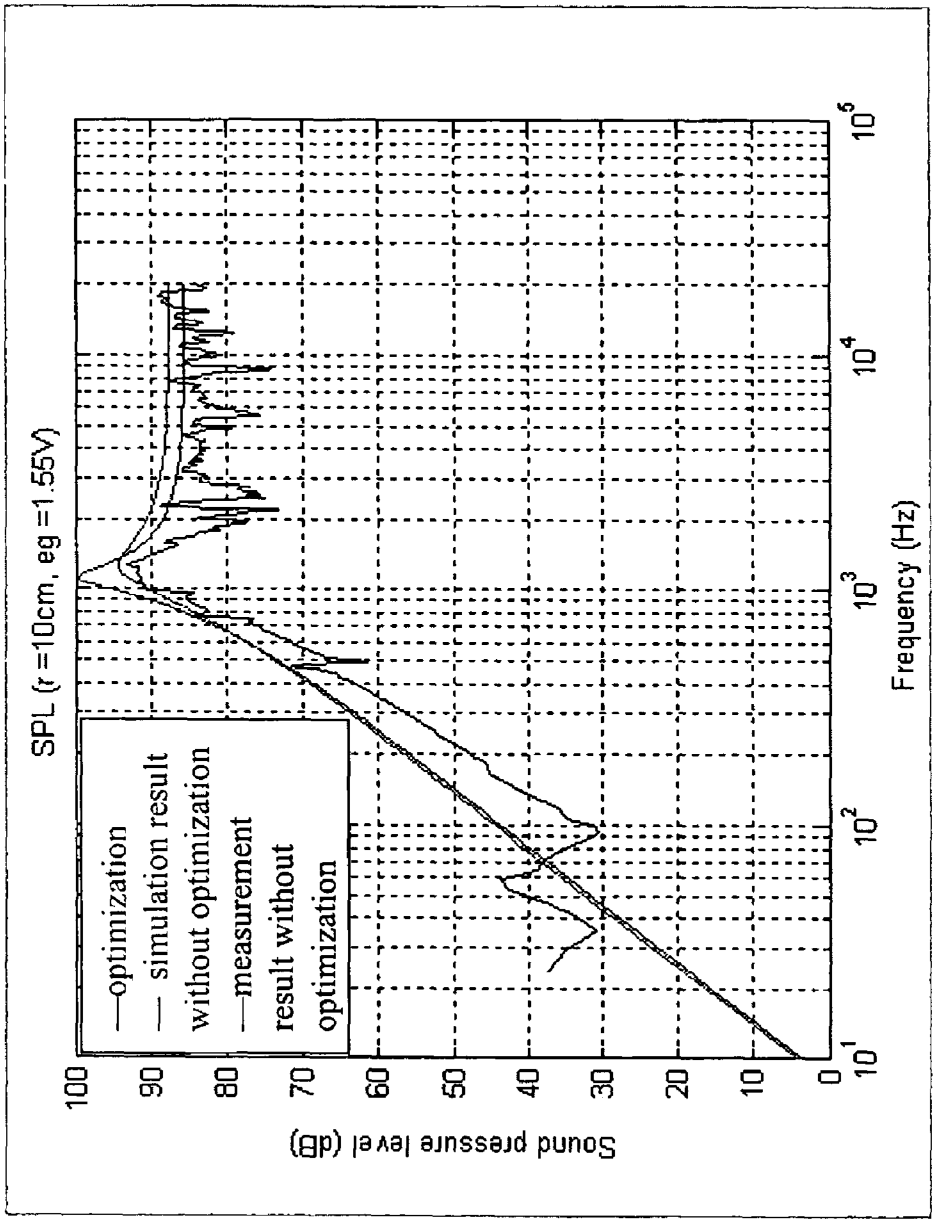
FIG. 5 is a diagram showing the axial sound pressure frequency response functions before and after the parameter optimization of the axial sound pressure sensitivity of a microspeaker.

Refer to FIG. 5 for the comparison between the frequency response functions of axial sound pressure before and after the parameter optimization, wherein the red curve is the measurement result of the frequency response functions of axial sound pressure after the parameter optimization, and the blue curve is the simulation result of the frequency response functions of axial sound pressure without the parameter optimization, and the black curve is the measurement result of the frequency response functions of axial sound pressure without the parameter optimization. In the parameter optimization, a Sequential Quadratic Programming method is used to optimize the sensitivity of axial sound pressure; the impedance of the microspeaker, the velocity of the vibrating diaphragm and the frequency response function of axial sound pressure are respectively obtained with the following equations:

$$Z_{VC}(s) = R_E + L_E s \square R'_E + R_{ES}\frac{(1/Q_{MS})(s/\omega_s)}{(s/\omega_s)^2 + (1/Q_{MS})(s/\omega_s) + 1} \tag{19}$$

$$U_D = \frac{S_D e_g}{Bl}\frac{R_{AE}}{R_{AT}}\frac{(1/Q_{TS})(s/\omega_s)}{(s/\omega_s)^2 + (1/Q_{TS})(s/\omega_s) + 1} \tag{20}$$

$$p(r = 1m) = \frac{\rho_0}{2\pi}\frac{Ble_g}{S_D R_E M_{AS}}\frac{(s/\omega_s)^2}{(s/\omega_s)^2 + (1/Q_{TS})(s/\omega_s) + 1} \tag{21}$$

wherein $R_{AT}$=$R_{AE}$+$R_{AS}$. It can be observed from FIG. 5 that the frequency response curve after the parameter optimization is smoother, i.e. the acoustic balance and the sensitivity of axial sound pressure of the microspeaker are better.

In summary, the present invention provides a method of utilizing an external electronic circuit to measure the impedance frequency response of a microspeaker. The simple external electronic circuit serves as the front-end and replaces the conventional impedance analyzer. Further, the present invention proposes a method for parameter identification of a microspeaker, wherein the parameters of a microspeaker are identified via measurement procedures for identifying electromechanical constants. After the parameters of the microspeaker have been calculated, the optimal parameter design can be obtained so that the microspeaker can achieve the best acoustic performance with minimum harmonic distortion.

Those embodiments described above are to clarify the present invention to enable the person skilled in the art to understand, make and use the present invention. However, it is not intended to limit the scope of the present invention. Any equivalent modification and variation according to the spirit of the present invention is to be also included within the claims of the present invention stated below.

What is claimed is:

1. A method for parameter identification of a microspeaker, comprising the following steps:

measuring the impedance frequency response of said microspeaker without a test box;

measuring the impedance frequency response of said microspeaker placed inside said test box;

utilizing a first simulation circuit to simulate the peak value of the impedance frequency response curve of said microspeaker without the test box, and utilizing a second simulation circuit to simulate the peak value of the impedance frequency response curve of said microspeaker placed inside said test box; and obtaining the parameters of said microspeaker via calculating the transfer functions of said first simulation circuit and said second simulation circuit.

2. The method for parameter identification of a microspeaker according to claim 1, wherein measuring the said impedance frequency response of said microspeaker further comprises the following steps:

inputting a voltage to a circuit comprising said microspeaker and a load with a known impedance;

connecting said voltage to a signal analyzer;

obtaining the voltage drop over said load, and inputting said voltage drop to said signal analyzer; and utilizing said signal analyzer to calculate the impedance frequency response of said microspeaker.

3. The method for parameter identification of a microspeaker according to claim 2, wherein one pole of said voltage is connected to said microspeaker, and the other pole of said voltage is connected to said microspeaker via said load.

4. The method for parameter identification of a microspeaker according to claim 2, wherein said voltage is an alternating signal output by a signal generator.

5. The method for parameter identification of a microspeaker according to claim 2, wherein said load is a resistance.

6. The method for parameter identification of a microspeaker according to claim 2, wherein said impedance frequency response is calculated with the equation:

$$Z = R\frac{e_s - e}{e} = R\left(\frac{1}{H(f)} - 1\right),$$

and Z is said impedance frequency response, H(f) is the impedance frequency response of said load, R is the impedance of said load, $e_s$ is said voltage, and e is said voltage drop over said load.

7. The method for parameter identification of a microspeaker according to claim 2, wherein said signal analyzer is a spectrum analyzer.

8. The method for parameter identification of a microspeaker according to claim 7, wherein said voltage is connected to a first channel of said spectrum analyzer, and said voltage drop over said load is connected to a second channel of said spectrum analyzer.

9. The method for parameter identification of a microspeaker according to claim 1, wherein said test box is an airtight chamber.

10. The method for parameter identification of a microspeaker according to claim 1, wherein said simulation circuit comprises a resistor, an inductor and a capacitor.

11. The method for parameter identification of a microspeaker according to claim 1, wherein simulating said peak value of the impedance frequency response curve is selecting appropriate values for elements of said simulation circuit so that the peak value of the frequency response curve of said simulation circuit is the same as the peak value of said impedance frequency response curve.

12. The method for parameter identification of a microspeaker according to claim 1, wherein said transfer function is a second-order transfer function.

13. The method for parameter identification of a microspeaker according to claim 1, wherein said parameters include resonance frequency, mechanical system quality factor, electrical system quality factor, resonance frequency of said microspeaker placed inside said test box, mechanical system quality factor of said microspeaker placed inside said test box, electrical system quality factor of said microspeaker placed inside said test box, mechanical-system mass, compliance, mechanical resistance, motor constant, acoustic resistance, acoustic mass, equivalent coil resistance, and equivalent coil inductance.

14. The method for parameter identification of a microspeaker according to claim 13, wherein said resonance frequency and said mechanical system quality factor are obtained from the coefficients of said transfer function.

15. The method for parameter identification of a microspeaker according to claim 13, wherein said electrical system quality factor is calculated from said mechanical system quality factor.

16. The method for parameter identification of a microspeaker according to claim 13, wherein said mechanical-system mass, said compliance, said mechanical resistance, said motor constant, said acoustic resistance, said acoustic mass, said equivalent coil resistance, and said equivalent coil inductance are calculated from said electrical system quality factor and said electrical system quality factor of said microspeaker placed inside said test box.

17. The method for parameter identification of a microspeaker according to claim 1, further comprising a parameter optimization process, which utilizes an optimization algorithm to optimize a target parameter.

18. The method for parameter identification of a microspeaker according to claim 17, wherein said optimization algorithm utilizes a Sequential Quadratic Programming method.

19. The method for parameter identification of a microspeaker according to claim 17, wherein said target parameter may be an axial sound pressure sensitivity, which is the value of the sound pressure sensitivity at the axial distance of 1 meter and under the voltage of 1 $V_{rms}$.

20. A method for parameter optimization of a microspeaker, comprising the following step:

performing parameter identification of at least one microspeaker; and selecting a target parameter and at least a limit parameter, which is used as a limiting condition, from said parameters; said target parameter being optimized with an optimization algorithm under said limiting condition;

wherein said parameter identification further comprising the following steps:

measuring the impedance frequency response of said microspeaker without a test box;

measuring the impedance frequency response of said microspeaker placed inside said test box;

utilizing a first simulation circuit to simulate the peak value of the impedance frequency response curve of said microspeaker without the test box, and utilizing a second simulation circuit to simulate the peak value of the impedance frequency response curve of said microspeaker placed inside said test box; and obtaining the parameters of said microspeaker via calculating the transfer functions of said first simulation circuit and said second simulation circuit.

21. The method for parameter optimization of a microspeaker according to claim 20, wherein said optimization algorithm utilizes a Sequential Quadratic Programming method.

22. The method for parameter optimization of a microspeaker according to claim 20, wherein said target parameter may be an axial sound pressure sensitivity, which is the value of the sound pressure sensitivity at the axial distance of 1 meter and under the voltage of 1 $V_{rms}$.

23. The method for parameter optimization of a microspeaker according to claim 20, wherein said limit parameter may be vibrating diaphragm displacement, magnetic flux density, acoustic compliance or resonance frequency.

24. The method for parameter optimization of a microspeaker according to claim 20, wherein measuring said impedance frequency response of said microspeaker further comprises the following steps:

inputting a voltage to a circuit comprising said microspeaker and a load with a known impedance;

connecting said voltage to a signal analyzer;

obtaining the voltage drop over said load, and inputting said voltage drop to said signal analyzer; and utilizing said signal analyzer to calculate the impedance frequency response of said microspeaker.

25. The method for parameter optimization of a microspeaker according to claim 24, wherein one pole of said voltage is connected to said microspeaker, and the other pole of said voltage is connected to said microspeaker via said load.

26. The method for parameter optimization of a microspeaker according to claim 24, wherein said voltage is an alternating signal output by a signal generator.

27. The method for parameter optimization of a microspeaker according to claim 24, wherein said load is a resistance.

28. The method for parameter optimization of a microspeaker according to claim 24, wherein said impedance frequency response is calculated with the equation:

$$Z = R\frac{e_s - e}{e} = R\left(\frac{1}{H(f)} - 1\right),$$

and Z is said impedance frequency response, H(f) is the impedance frequency response of said load, R is the impedance of said load, $e_s$ is said voltage, and e is said voltage drop over said load.

29. The method for parameter optimization of a microspeaker according to claim 24, wherein said signal analyzer is a spectrum analyzer.

30. The method for parameter optimization of a microspeaker according to claim 29, wherein said voltage is connected to a first channel of said spectrum analyzer, and said voltage drop over said load is connected to a second channel of said spectrum analyzer.

31. The method for parameter optimization of a microspeaker according to claim 20, wherein said test box is an airtight chamber.

32. The method for parameter optimization of a microspeaker according to claim 20, wherein said simulation circuit comprises a resistor, an inductor and a capacitor.

33. The method for parameter optimization of a microspeaker according to claim 20, wherein simulating said peak value of said impedance frequency response curve is selecting appropriate values for elements of said simulation circuit so that the peak value of the frequency response curve of said simulation circuit is the same as the peak value of said impedance frequency response curve.

34. The method for parameter optimization of a microspeaker according to claim 20, wherein said transfer function is a second-order transfer function.

35. The method for parameter optimization of a microspeaker according to claim 20, wherein said parameters include resonance frequency, mechanical system quality factor, electrical system quality factor, resonance frequency of said microspeaker placed inside said test box, mechanical system quality factor of said microspeaker placed inside said test box, electrical system quality factor of said microspeaker placed inside said test box, mechanical-system mass, compliance, mechanical resistance, motor constant, acoustic resistance, acoustic mass, equivalent coil resistance, and equivalent coil inductance.

36. The method for parameter optimization of a microspeaker according to claim 35, wherein said resonance frequency and said mechanical system quality factor are obtained from the coefficients of said transfer function.

37. The method for parameter optimization of a microspeaker according to claim 35, wherein said electrical system quality factor is calculated from said mechanical system quality factor.

38. The method for parameter optimization of a microspeaker according to claim 35, wherein said mechanical-system mass, said compliance, said mechanical resistance, said motor constant, said acoustic resistance, said acoustic mass, said equivalent coil resistance, and said equivalent coil inductance are calculated from said electrical system quality factor and said electrical system quality factor of said microspeaker placed inside said test box.

39. A method for measuring impedance frequency response of a microspeaker, comprising the following steps:

inputting a voltage to a circuit comprising said microspeaker and a load with a known impedance;

connecting said voltage to a signal analyzer;

obtaining the voltage drop over said load, and inputting said voltage drop to said signal analyzer; and utilizing said voltage drop data inputted to the signal analyzer to calculate the impedance frequency response of said microspeaker, wherein one pole of said voltage is connected directly to said microspeaker, and the other pole of said voltage is connected to said microspeaker via said load.

40. The method for measuring impedance frequency response of a microspeaker according to claim 39, wherein said voltage is an alternating signal output by a signal generator.

41. The method for measuring impedance frequency response of a microspeaker according to claim 39, wherein said load is a resistance.

42. The method for measuring impedance frequency response of a microspeaker according to claim 39, wherein said impedance frequency response is calculated with the equation:

$$Z = R\frac{e_s - e}{e} = R\left(\frac{1}{H(f)} - 1\right),$$

and Z is said impedance frequency response, H(f) is the impedance frequency response of said load, R is the impedance of said load, $e_s$ is said voltage, and e is said voltage drop over said load.

43. The method for measuring impedance frequency response of a microspeaker according to claim 39, wherein said signal analyzer is a spectrum analyzer.

44. The method for measuring impedance frequency response of a microspeaker according to claim 43, wherein said voltage is connected to a first channel of said spectrum analyzer, and said voltage drop over said load is connected to a second channel of said spectrum analyzer.

* * * * *